US011888210B2

(12) United States Patent
Chen et al.

(10) Patent No.: US 11,888,210 B2
(45) Date of Patent: Jan. 30, 2024

(54) ELECTRONIC PACKAGE AND METHOD OF MANUFACTURING THE SAME

(71) Applicant: Advanced Semiconductor Engineering, Inc., Kaohsiung (TW)

(72) Inventors: Jenchun Chen, Kaohsiung (TW); Ya-Wen Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 203 days.

(21) Appl. No.: 17/396,601

(22) Filed: Aug. 6, 2021

(65) Prior Publication Data

US 2023/0037915 A1 Feb. 9, 2023

(51) Int. Cl.

| | |
|---|---|
| ***H01Q 1/22*** | (2006.01) |
| ***H01L 23/66*** | (2006.01) |
| ***H01Q 1/42*** | (2006.01) |
| ***H01Q 1/40*** | (2006.01) |
| ***H01Q 21/06*** | (2006.01) |
| ***H01Q 21/08*** | (2006.01) |
| ***H01Q 9/04*** | (2006.01) |

(52) U.S. Cl.

CPC .......... *H01Q 1/2283* (2013.01); *H01L 23/66* (2013.01); *H01Q 1/40* (2013.01); *H01Q 1/422* (2013.01); *H01Q 9/0414* (2013.01); *H01Q 21/065* (2013.01); *H01Q 21/08* (2013.01); *H01L 2223/6677* (2013.01); *H01L 2223/6688* (2013.01)

(58) Field of Classification Search

CPC .......... H01Q 1/2283; H01Q 1/40; H01Q 1/42; H01Q 1/422; H01Q 9/0414; H01Q 21/065; H01Q 21/08; H01L 23/66; H01L 2223/6677; H01L 2223/6688

See application file for complete search history.

(56) References Cited

U.S. PATENT DOCUMENTS

2020/0328530 A1* 10/2020 Park .......................... H01Q 1/243
2022/0263225 A1* 8/2022 Jia .......................... H01Q 1/243

* cited by examiner

*Primary Examiner* — Robert Karacsony
(74) *Attorney, Agent, or Firm* — FOLEY & LARDNER LLP

(57) ABSTRACT

The present disclosure provides an electronic package. The electronic package includes an antenna structure having a first antenna and a second antenna at least partially covered by the first antenna. The electronic package also includes a directing element covering the antenna structure. The directing element has a first portion configured to direct a first electromagnetic wave having a first frequency to transmit via the first antenna and a second portion configured to direct a second electromagnetic wave having a second frequency different from the first frequency to transmit via the second antenna. A method of manufacturing an electronic package is also provided.

15 Claims, 12 Drawing Sheets

ELECTRONIC PACKAGE AND METHOD OF MANUFACTURING THE SAME

BACKGROUND

1. Technical Field

The present disclosure relates to an electronic package and a method of manufacturing the same.

2. Description of the Related Art

Wireless communication systems may require multiple-band antennas for transmitting and receiving radio frequency (RF) at different frequency bands to support, e.g., higher data rates, increased functionality, and more users. Therefore, it is desirable for an antenna to have multiple-band performance.

SUMMARY

In some embodiments, the electronic package includes an antenna structure having a first antenna and a second antenna at least partially covered by the first antenna. The electronic package also includes a directing element covering the antenna structure. The directing element has a first portion configured to direct a first electromagnetic wave having a first frequency to transmit via the first antenna and a second portion configured to direct a second electromagnetic wave having a second frequency different from the first frequency to transmit via the second antenna.

In some embodiments, the electronic package includes an antenna structure having a first region and a second region. The electronic package also includes a directing element covering the first region of the antenna structure and exposing a part of the second region of the antenna structure. The directing element has a first portion configured to direct a first electromagnetic wave having a first frequency to transmit within the first portion and a second portion configured to direct a second electromagnetic wave having a second frequency different from the first frequency to transmit within the second portion.

In some embodiments, a method of manufacturing an electronic package includes providing a radiating structure having a first region and a second region. The method also includes disposing a directing element over the radiating structure to cover the first region of the radiating structure and to expose a part of the second region of the radiating structure. The directing element comprises a first portion configured to direct a first electromagnetic wave having a first frequency to transmit within the first portion and a second portion configured to direct a second electromagnetic wave having a second frequency different from the first frequency to transmit within the second portion.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
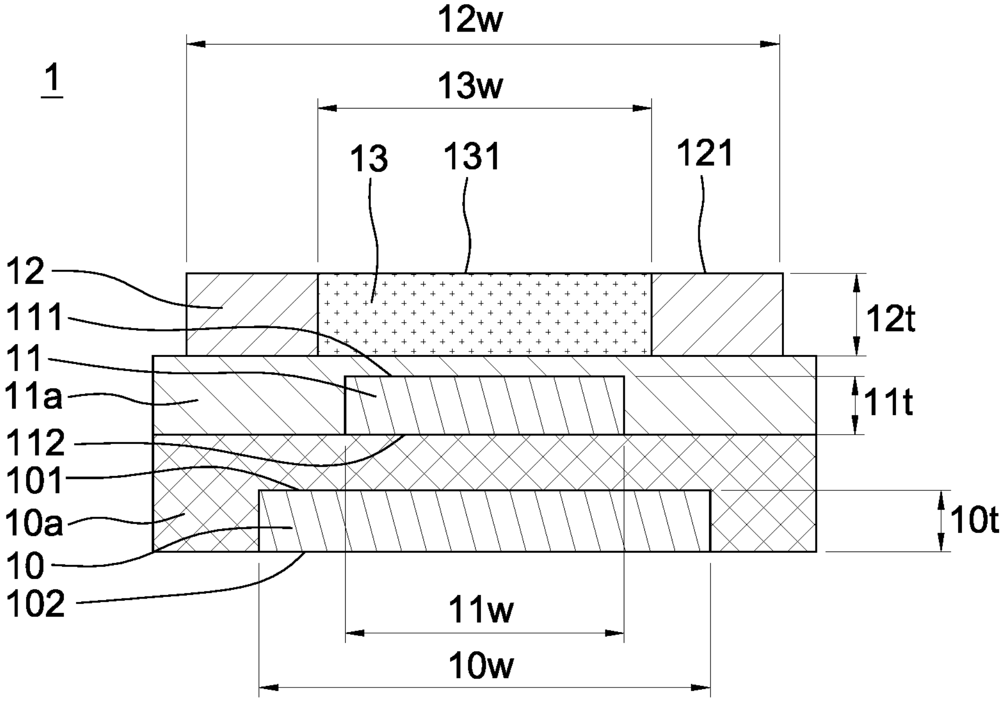
FIG. 1A illustrates a cross-sectional view of a part of an electronic package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following description involves an electronic package and a method of manufacturing an electronic package.

FIG. 1A illustrates a cross-sectional view of a part of an electronic package in accordance with some embodiments of the present disclosure. In some embodiments, FIG. 1A illustrates a cross-sectional view of an antenna module 1. In some embodiments, the antenna module 1 of FIG. 1A may be a part of an electronic package 8 of FIG. 8. In some embodiments, the antenna module 1 of FIG. 1A may include a radiating structure and a directing element disposed on the radiating structure. In some embodiments, the radiating structure of the antenna module 1 may include an antenna structure. In some embodiments, the radiating structure of the antenna module 1 may include antennas 10, 11, and dielectric layers 10*a*, 11*a*. In some embodiments, the directing element of the antenna module 1 may include portions 12 and 13.

In some embodiments, the antenna 11 may be disposed over the antenna 10. In some embodiments, the antenna 10 and the antenna 11 may be physically separated by the dielectric layer 10*a*. In some embodiments, the antenna 10 may have a surface 101 facing the antenna 11 and the antenna 11 may have a surface 111 facing away from the antenna 10. In some embodiments, the surface 101 and the surface 111 may be substantially parallel. In some embodiments, the antenna 10 and the antenna 11 may be at least partially overlapped in a direction substantially perpendicular to the surface 101 and the surface 111. In some embodiments, the antenna 10 may be covered by the antenna 11 in a direction substantially perpendicular to the surface 101 and the surface 111. In some embodiments, the antenna 10 may be at least partially covered by the antenna 11 in a direction substantially perpendicular to the surface 101 and the surface 111. In some embodiments, the antenna 11 may be entirely disposed within the area of the antenna 10 in a direction substantially perpendicular to the surface 101 and the surface 111. In some embodiments, an end of the antenna 10 and an end of the antenna 11 may not be overlapped in a direction substantially perpendicular to the surface 101 and the surface 111. For example, the ends of the antenna 11 may be spaced apart from the ends of the antenna 10 in a direction substantially parallel to the surface 101 and the surface 111. For example, the ends of the antenna 11 may be disposed within the area of the antenna 10 in a direction substantially perpendicular to the surface 101 and the surface 111.

In some embodiments, the antenna 10 and the antenna 11 may each include a patch antenna, such as a planar inverted-F antenna (PIFA) or other feasible kinds of antennas. In some embodiments, the antenna 10 and the antenna 11 may each include a conductive material such as a metal or metal alloy. Examples of the conductive material include gold (Au), silver (Ag), aluminum (Al), copper (Cu), platinum (Pt), Palladium (Pd), other metal(s) or alloy(s), or a combination of two or more thereof.

In some embodiments, the antenna 10 and the antenna 11 may have different frequencies (or operating frequencies) or bandwidths (or operating bandwidths). For example, the antenna 10 and the antenna 11 may be configured to radiate electromagnetic waves having different frequencies or different wavelengths. For example, the antenna 11 (which can be referred to as a high-band antenna) may have an operating frequency higher than an operating of the antenna 10 (which can be referred to as a low-band antenna). For example, the antenna 10 may be operated in a frequency of about 28 GHz. For example, the antenna 10 may be configured to radiate or receive electromagnetic waves with a frequency of about 28 GHz. For example, the antenna 11 may be operated in a frequency of about 39 GHz. For example, the antenna 11 may be configured to radiate or receive electromagnetic waves with a frequency of about 39 GHz. By incorporating the antennas having different operating frequencies, the antenna module 1 may achieve multi-band (or multi-frequency) radiation.

In some embodiments, the antenna 10 and the antenna 11 may have different dimensions. For example, the antenna 10 may have a thickness 10*t* measured in a direction substantially perpendicular to the surface 101, and the antenna 11 may have a thickness 11*t* measured in a direction substantially perpendicular to the surface 111. The thickness 10*t* of the antenna 10 and the thickness 11*t* of the antenna 11 may be different. For example, the thickness 10*t* of the antenna 10 may be greater than the thickness 11*t* of the antenna 11. For example, the antenna 10 may have a width 10*w* measured in a direction substantially parallel to the surface 101, and the antenna 11 may have a width 11*w* measured in a direction substantially parallel to the surface 111. In some embodiments, the widths 10*w* and 11*w* may be measured between two lateral surfaces (or two ends) of the antennas 10 and 11 from a cross-sectional view as shown in FIG. 1A. The width 10*w* of the antenna 10 and the width 11*w* of the antenna 11 may be different. For example, the width 10*w* of the antenna 10 may be greater than the width 11*w* of the antenna 11.

The patterns or sequences of the antennas may be different from the above descriptions, and the illustrations and the patterns or sequences of the antennas may not be limited thereto. In some embodiments, antennas of more than two different frequencies or bandwidths may be incorporated in the antenna module 1.

In some embodiments, the dielectric layer 10*a* may cover the antenna 10. In some embodiments, the dielectric layer 10*a* may encapsulate the antenna 10. In some embodiments, the dielectric layer 10*a* may contact the surface 101 of the antenna 10. In some embodiments, the dielectric layer 10*a* may contact the lateral surfaces (or ends) of the antenna 10. In some embodiments, a surface of the dielectric layer 10*a* may substantially be coplanar with a surface 102 the antenna 10 opposite to the surface 101.

In some embodiments, the dielectric layer 11*a* may be disposed on the dielectric layer 10*a* and cover the antenna 11. In some embodiments, the dielectric layer 11*a* may encapsulate the antenna 11. In some embodiments, the dielectric layer 11*a* may contact the surface 111 of the antenna 11. In some embodiments, the dielectric layer 11*a* may contact the lateral surfaces (or ends) of the antenna 11. In some embodiments, a surface of the dielectric layer 11*a* may substantially be coplanar with a surface 112 the antenna 11 opposite to the surface 111. In some embodiments, the surface 112 the antenna 11 may contact the dielectric layer 10*a*.

In some embodiments, a part of the dielectric layer 10*a* may be disposed between the antenna 10 and the antenna 11. In some embodiments, the antenna 11 may be disposed between the dielectric layer 10*a* and dielectric layer 11*a*.

In some embodiments, the dielectric layer 10*a* and the dielectric layer 11*a* may each include a solder resist or a solder mask. In some embodiments, the dielectric layer 10*a* and the dielectric layer 11*a* may each have a dielectric constant (Dk) between about 8 and about 12, such as about 10. In some embodiments, the dielectric layer 10*a* and the dielectric layer 11*a* may have the same material or the same Dk. In some embodiments, the dielectric layer 10*a* and the dielectric layer 11*a* may have different materials or different Dk.

In some embodiments, a thickness of the dielectric layer 11*a* measured in a direction substantially perpendicular to the surface 111 of the antenna 11 may be different from a thickness of the dielectric layer 10*a* measured in a direction substantially perpendicular to the surface 101 of the antenna 10. For example, the thickness of the dielectric layer 11*a* may be less than the thickness of the dielectric layer 10*a*. In some embodiments, electromagnetic waves radiated or received by the antenna 10 may pass through the dielectric layer 11*a*, and the thickness of the dielectric layer 11*a* may be designed to not change the resonant frequency point of the antenna 10 and to reduce the transmission losses of the electromagnetic waves thereof. For example, the thickness of the dielectric layer 11*a* measured in a direction substantially perpendicular to the surface 111 of the antenna 11 may be equal to or less than about 10 micrometers (μm).

In some embodiments, the directing element (including the portion 12 and the portion 13) of the antenna module 1 may be disposed on the dielectric layer 11*a*. In some embodiments, the antenna 11 may be disposed between the antenna 10 and the directing element of the antenna module 1.

In some embodiments, the portion 12 may surround the portion 13. In some embodiments, the portion 12 may be around the portion 13. In some embodiments, the portion 12 may encircle the portion 13. In some embodiments, the portion 12 may border the portion 13. In some embodiments, the portion 12 may contact the portion 13. In some embodiments, the portion 12 may be adjacent to the portion 13. In some embodiments, the portion 13 may be inside of the portion 12. In some embodiments, the portion 13 may be at the center of the portion 12. In some embodiments, the portion 12 may have a surface 121 facing away from the radiating structure of the antenna module 1. In some embodiments, the portion 13 may have a surface 131 facing away from the radiating structure of the antenna module 1. In some embodiments, the surface 121 and the surface 131 may be substantially coplanar. In some embodiments, the surface 121 and the surface 131 may be substantially aligned.

In some embodiments, the portion 12 and the portion 13 may each include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. In some embodiments, the portion 12 and the portion 13 may each include a dielectric ceramic such as $Al_2O_3$, $Mg_2SiO_4$, $MgAl_2O_4$, $CoAl_2O_4$, or other feasible dielectric ceramics that have a standard Q-value. In some embodiments, the portion 12 and the portion 13 may have the same material or the same Dk. In some embodiments, the portion 12 and the portion 13 may have different materials or different Dk.

For example, a Dk of the portion 12 (which can be referred to as a low-Dk dielectric layer) may be lower than a Dk of the portion 13 (which can be referred to as a high-Dk dielectric layer). For example, the portion 12 may have a Dk between about 17 and about 21, such as about 19. For example, the portion 13 may have a Dk between about 36 and about 40, such as about 38. In some embodiments, a Dk of the portion 12 may be higher than a Dk of the dielectric layer 10*a* and/or a Dk of the dielectric layer 11*a*. In some embodiments, a Dk of the portion 13 may be higher than a Dk of the dielectric layer 10*a* and/or a Dk of the dielectric layer 11*a*.

In some embodiments, the portion 12 and the portion 13 may be configured to direct electromagnetic waves having different frequencies or different wavelengths. In some embodiments, the portion 12 may be configured to direct the electromagnetic waves radiated or received by the antenna 10. For example, the electromagnetic waves radiated or received by the antenna 10 may be transmitted within the portion 12.

For example, the portion 12 may be configured to guide the electromagnetic waves radiated by the antenna 10 to the outside of the antenna module 1. For example, the portion 12 may be configured to guide the electromagnetic waves (on which the antenna 10 can be operated) from the outside of the antenna module 1 to the antenna 10. For example, the portion 12 may be configured to guide the electromagnetic waves (on which the antenna 10 can be operated) to transmit via the antenna 10. In some embodiments, the electromagnetic waves radiated or received by the antenna 11 may not be transmitted within the portion 12. For example, the electromagnetic waves radiated or received by the antenna 11 may be free from being transmitted within the portion 12.

In some embodiments, the portion 13 may be configured to direct electromagnetic waves radiated or received by the antenna 11. For example, the electromagnetic waves radiated or received by the antenna 11 may be transmitted within the portion 13.

For example, the portion 13 may be configured to guide the electromagnetic waves radiated by the antenna 11 to the outside of the antenna module 1. For example, the portion 13 may be configured to guide the electromagnetic waves (on which the antenna 11 can be operated) from the outside of the antenna module 1 to the antenna 11. For example, the portion 13 may be configured to guide the electromagnetic waves (on which the antenna 11 can be operated) to transmit via the antenna 11. In some embodiments, the electromagnetic waves radiated or received by the antenna 10 may not be transmitted within the portion 13. For example, the electromagnetic waves radiated or received by the antenna 10 may be free from being transmitted within the portion 13.

In some embodiments, a width 12*w* of the portion 12 may be greater than the width 10*w* of the antenna 10 and the width 11*w* of the antenna 11. In some embodiments, a width 13*w* of the portion 13 may be less than the width 10*w* of the antenna 10 and greater than the width 11*w* of the antenna 11. In some embodiments, the lateral surface of the directing element (i.e., the lateral surface of portion 12) may be misaligned with the lateral surface of the dielectric layer 10*a* and/or the lateral surface of dielectric layer 11*a*. For example, the lateral surface of the directing element (i.e., the lateral surface of portion 12) may be non-coplanar with the lateral surface of the dielectric layer 10*a* and/or the lateral surface of dielectric layer 11*a*. However, in some other embodiments, the lateral surface of the directing element (i.e., the lateral surface of portion 12) may be aligned with the lateral surface of the dielectric layer 10*a* and/or the lateral surface of dielectric layer 11*a*. For example, the width 12*w* of the portion 12 may be substantially equal to a width of the dielectric layer 10*a* and/or a width of dielectric layer 11*a*.

In some embodiments, the portion 12 and the portion 13 may have a thickness 12*t*. In some embodiments, the thickness 12*t* may be designed to enhance the efficiency of the antenna module 1. In some embodiments, the thickness 12*t* may be ten times greater, twenty times greater, or thirty times greater than the thickness of the dielectric layer 11*a*. For example, the thickness 12*t* may be equal to or greater than about 350 μm.

Figure 1B:
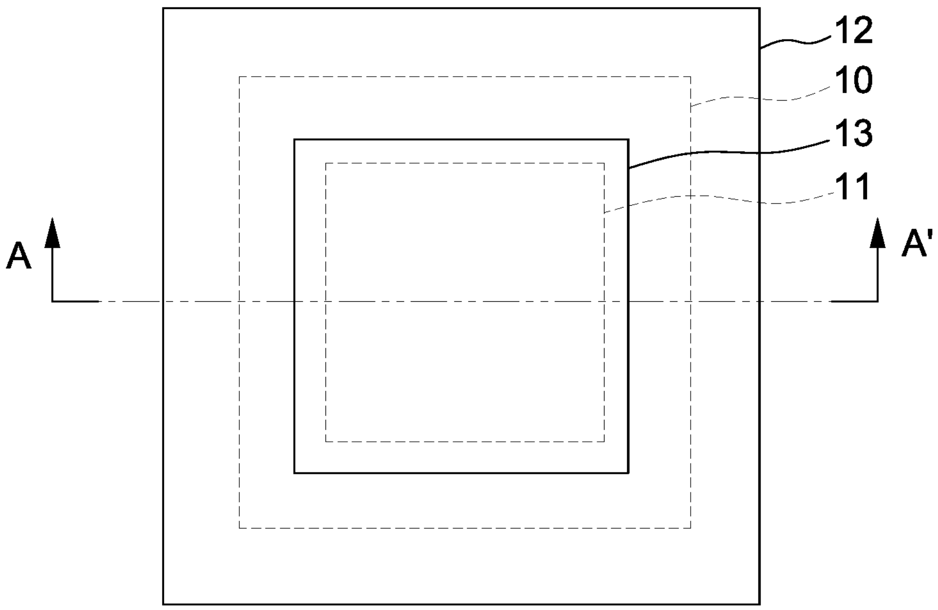
FIG. 1B illustrates a top view of a part of an electronic package in accordance with some embodiments of the present disclosure.

FIG. 1B illustrates a top view of a part of an electronic package in accordance with some embodiments of the present disclosure. In some embodiments, FIG. 1B illustrates a top view of the antenna module 1 of FIG. 1A. For example, the antenna module 1 of FIG. 1A may be a cross-sectional view along line AA' in FIG. 1B. The dielectric layers 10*a* and 11*a* in FIG. 1A are omitted in FIG. 1B for clarity and conciseness.

As shown in FIG. 1B, in some embodiments, the area of the antenna 11 is smaller than the area of the portion 13. In some embodiments, a projection of the antenna 11 is completely within a projection of the portion 13. In some embodiments, the area of the antenna 11 is smaller than the area of the antenna 10. In some embodiments, a projection of the antenna 11 is completely within a projection of the antenna 10. In some embodiments, the area of the antenna 11 is smaller than the area of the portion 12. In some embodiments, a projection of the antenna 11 is completely within a projection of the portion 12.

In some embodiments, the area of the portion 13 is larger than the area of the antenna 11. In some embodiments, the area of the portion 13 is smaller than the area of the antenna 10. In some embodiments, a projection of the portion 13 is completely within a projection of the antenna 10. In some embodiments, the area of the portion 13 is smaller than the area of the portion 12. In some embodiments, a projection of the portion 13 is completely within a projection of the portion 12.

In some embodiments, the area of the antenna 10 is larger than the area of the antenna 11. In some embodiments, the area of the antenna 10 is larger than the area of the portion 13. In some embodiments, the area of the antenna 10 is smaller than the area of the portion 12. In some embodiments, a projection of the antenna 10 is completely within a projection of the portion 12.

In some embodiments, the area of the portion 12 is larger than the area of the antenna 11. In some embodiments, the area of the portion 12 is larger than the area of the portion 13. In some embodiments, the area of the portion 12 is larger than the area of the antenna 10. In some embodiments, a width of a projection of the directing element (i.e., the portions 12 and 13) on the antenna 10 may be substantially equal to a width of the antenna 10.

In some embodiments, by stacking or overlapping the high-band antenna (e.g., the antenna 11) and the low-band antenna (e.g., the antenna 10), the interference between the high-band antenna and the low-band antenna may be reduced, and the package size (e.g., the package size of the antenna module 1) may be reduced. In addition, by incorporating the high-Dk dielectric layer (e.g., the portion 13) into the low-Dk dielectric layer (e.g., the portion 12), the package size (e.g., the package size of the antenna module 1) may be reduced without compromising the antenna performance.

For example, the portion 12 may be configured to direct the electromagnetic waves radiated or received by the antenna 10, and the portion 13 may be configured to direct electromagnetic waves radiated or received by the antenna 11. Since the electrical characteristics (i.e., permittivity (c) and permeability (μ)) of the electromagnetic waves radiated or received by the antenna 10 and the antenna 11 of the radiating structure of the antenna module 1 are different, the transmission losses of the electromagnetic waves propagating through the portion 12 and the portion 13 of the directing element of the antenna module 1 are different (i.e., according to the Friis transmission equation).

In some embodiments, the portion 12 and the portion 13 of the directing element of the antenna module 1 may be adjusted to improve the performance of the antenna 10 and the antenna 11, respectively, of the radiating structure of the antenna module 1. For example, by proper adjustment of the dimensions, the compositions, the particle sizes, and/or the sintering temperatures of the portion 12 and the portion 13, the bandwidths of the electromagnetic waves may be increased, and the side lobes of the electromagnetic waves may be reduced. For example, the portion 12 and the portion 13 may help to separately compensate for phase shifts of the electromagnetic waves radiated or received by the antenna 10 and the antenna 11. Therefore, the directivity of the antenna module 1 may be enhanced and the gain of the antenna module 1 may be increased. For example, in comparison with an antenna module without a directing element, the loss in decibel (−dB) of an antenna module having a directing element may be improved by more than 5.00 dB. For example, by adjusting the directing element to match the radiating structure, the loss in decibel (−dB) may be improved by more than 10.00 dB. For example, the loss in decibel (−dB) of the antenna 11 between 37.00 GHz and 40.00 GHz may be improved by more than 15.00 dB.

Figure 1C:
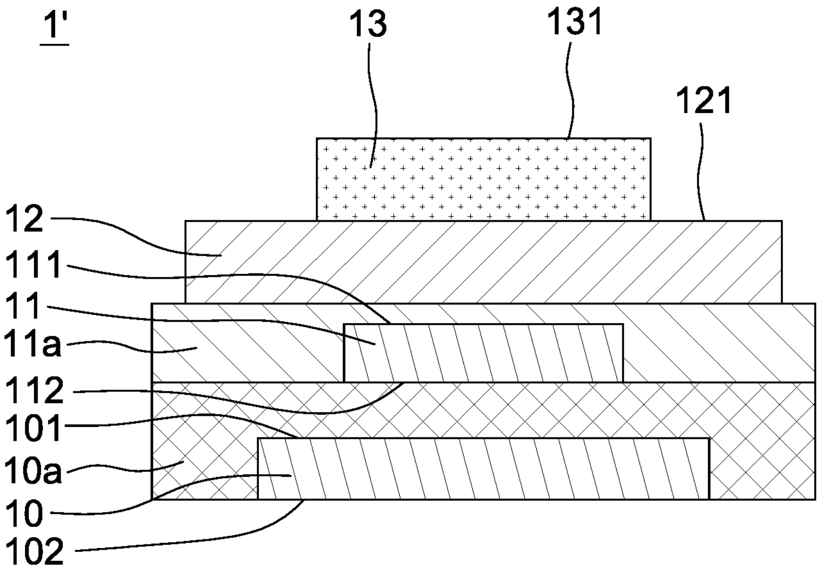
FIG. 1C illustrates a cross-sectional view of a part of an electronic package in accordance with some embodiments of the present disclosure.

FIG. 1C illustrates a cross-sectional view of a part of an electronic package in accordance with some embodiments of the present disclosure. In some embodiments, FIG. 1C illustrates a cross-sectional view of an antenna module 1'. In some embodiments, the antenna module 1' of FIG. 1C may be a part of the electronic package 8 of FIG. 8.

The antenna module 1' of FIG. 1C is similar to the antenna module 1 in FIG. 1A except that the portion 13 is disposed on the surface 121 of the portion 12. For example, the portion 13 may cover the surface 121 of the portion 12. In some embodiments, the antenna module 1' of FIG. 1C may be a cross-sectional view along line AA' in FIG. 1B. For example, from a top view, the portion 12 may be around the portion 13. In some embodiments, the electromagnetic waves radiated or received by the antenna 11 may be transmitted within the portion 12 and the portion 13.

Figure 2:
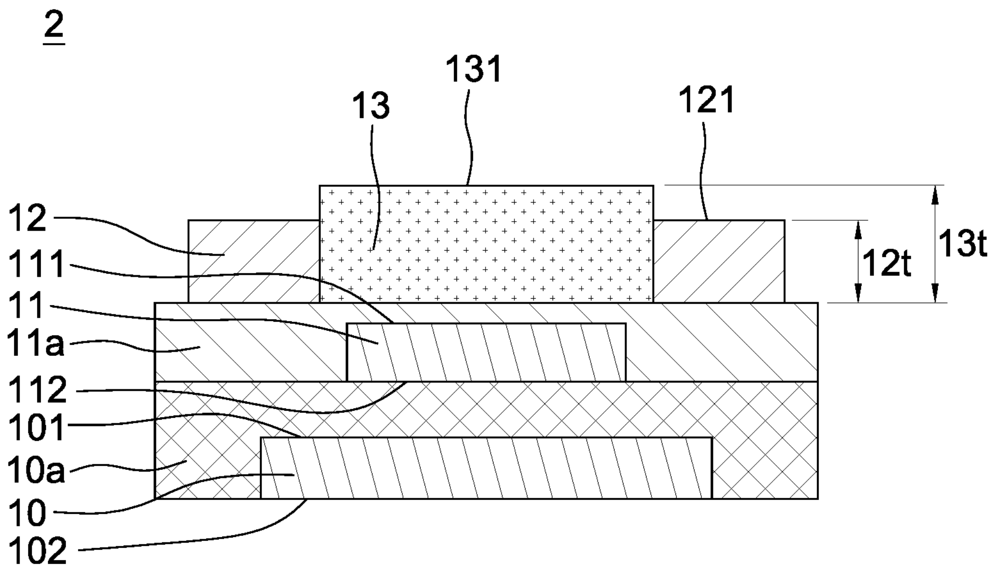
FIG. 2 illustrates a cross-sectional view of a part of an electronic package in accordance with some embodiments of the present disclosure.

FIG. 2 illustrates a cross-sectional view of a part of an electronic package in accordance with some embodiments of the present disclosure. In some embodiments, FIG. 2 illustrates a cross-sectional view of an antenna module 2. In some embodiments, the antenna module 2 of FIG. 2 may be a part of the electronic package 8 of FIG. 8.

The antenna module 2 of FIG. 2 is similar to the antenna module 1 in FIG. 1A except that the surface 121 of the portion 12 and the surface 131 of the portion 13 are not coplanar. For example, the surface 131 of the portion 13 may protrude from the surface 121 of the portion 12. For example, a thickness 13*t* of the portion 13 may be greater than a thickness 12*t* of the portion 12.

Figure 3:
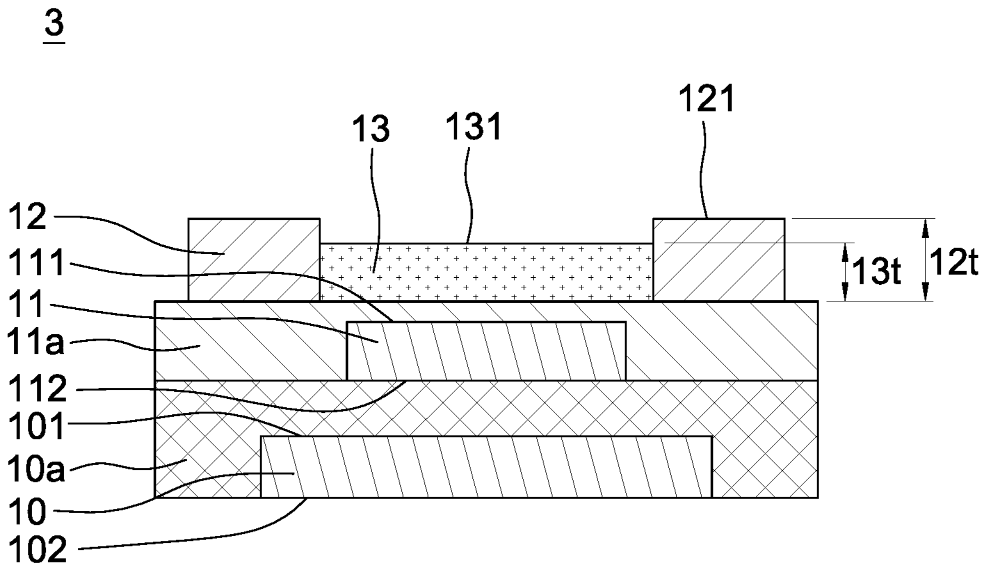
FIG. 3 illustrates a cross-sectional view of a part of an electronic package in accordance with some embodiments of the present disclosure.

FIG. 3 illustrates a cross-sectional view of a part of an electronic package in accordance with some embodiments of the present disclosure. In some embodiments, FIG. 3 illustrates a cross-sectional view of an antenna module 3. In some embodiments, the antenna module 3 of FIG. 3 may be a part of the electronic package 8 of FIG. 8.

The antenna module 3 of FIG. 3 is similar to the antenna module 1 in FIG. 1A except that the surface 121 of the portion 12 and the surface 131 of the portion 13 are not coplanar. For example, the surface 131 of the portion 13 may be recessed from the surface 121 of the portion 12. For example, a thickness 13*t* of the portion 13 may be less than a thickness 12*t* of the portion 12.

Figure 4A:
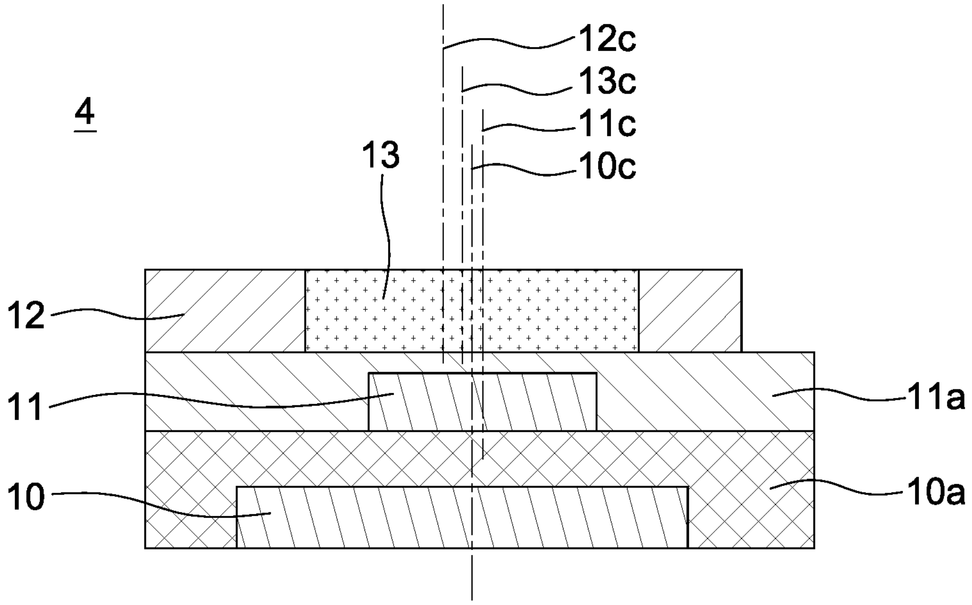
FIG. 4A illustrates a cross-sectional view of a part of an electronic package in accordance with some embodiments of the present disclosure.

FIG. 4A illustrates a cross-sectional view of a part of an electronic package in accordance with some embodiments of the present disclosure. In some embodiments, FIG. 4A illustrates a cross-sectional view of an antenna module 4. In some embodiments, the antenna module 4 of FIG. 4A may be a part of the electronic package 8 of FIG. 8.

The antenna module 4 of FIG. 4A is similar to the antenna module 1 in FIG. 1A, and the differences therebetween are described below.

In some embodiments, a central axis 10*c* of the antenna 10 may not be aligned with a central axis 12*c* of the portion 12. In some embodiments, the central axis 10*c* of the antenna 10 may be spaced apart from the central axis 12*c* of the portion 12. In some embodiments, a distance between the central axis 10*c* of the antenna 10 and the central axis 12*c* of the portion 12 may be less than the wavelengths of the electromagnetic waves radiated or received by the antenna 10.

In some embodiments, since the portion 12 can cover the antenna 10 and direct the electromagnetic waves radiated or received by the antenna 10, an offset tolerance for the portion 12 is accepted, and a better manufacturing rate can be obtained.

In some embodiments, a central axis 11*c* of the antenna 11 may not be aligned with a central axis 13*c* of the portion 13. In some embodiments, the central axis 11*c* of the antenna 11 may be spaced apart from the central axis 13*c* of the portion 13. In some embodiments, a distance between the central axis 11*c* of the antenna 11 and the central axis 13*c* of the portion 13 may be less than the wavelengths of the electromagnetic waves radiated or received by the antenna 11.

In some embodiments, since the portion 13 can cover the antenna 11 and direct the electromagnetic waves radiated or received by the antenna 11, an offset tolerance for the portion 13 is accepted, and a better manufacturing rate can be obtained.

Figure 4B:
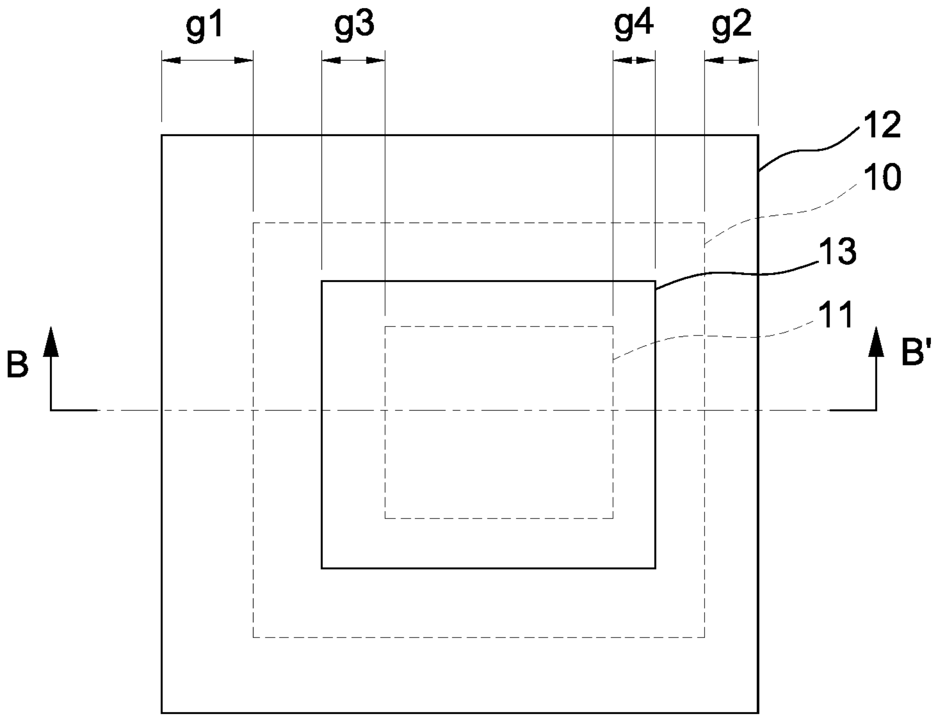
FIG. 4B illustrates a top view of a part of an electronic package in accordance with some embodiments of the present disclosure.

FIG. 4B illustrates a top view of a part of an electronic package in accordance with some embodiments of the present disclosure. In some embodiments, FIG. 4B illustrates a top view of the antenna module 4 of FIG. 4A. For example, the antenna module 4 of FIG. 4A may be a cross-sectional view along line BB' in FIG. 4B. The dielectric layers 10*a* and 11*a* in FIG. 4A are omitted in FIG. 4B for clarity and conciseness.

As shown in FIG. 4B, in some embodiments, the antenna 10 is covered by the portion 12. The antenna 10 is closer to a side of the portion 12, and distal from an opposite side of the portion 12. For example, a gap g1 is defined between a side of the antenna 10 and a side of the portion 12. A gap g2 is defined between an opposite side of the antenna 10 and an opposite side of the portion 12. The gap g1 may be greater than the gap g2.

In some embodiments, the antenna 11 is covered by the portion 13. The antenna 11 is closer to a side of the portion 13, and distal from an opposite side of the portion 13. For example, a gap g3 is defined between a side of the antenna 11 and a side of the portion 13. A gap g4 is defined between an opposite side of the antenna 11 and an opposite side of the portion 13. The gap g3 may be greater than the gap g4.

Figure 5:
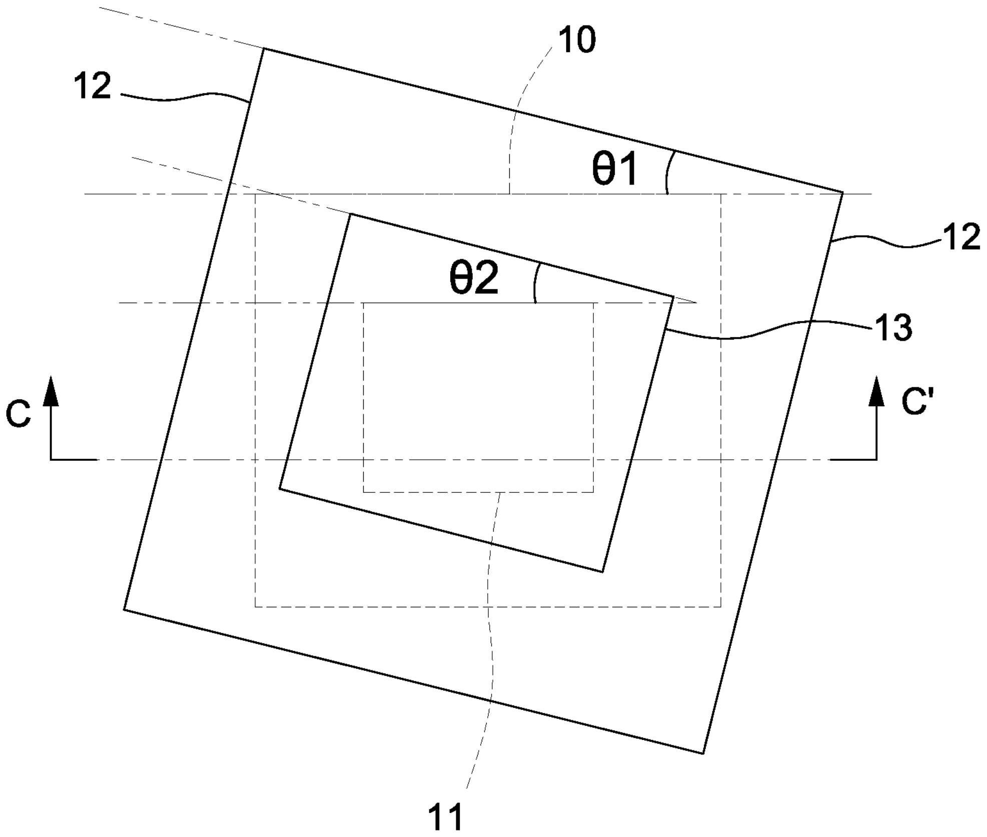
FIG. 5 illustrates a top view of a part of an electronic package in accordance with some embodiments of the present disclosure.

FIG. 5 illustrates a top view of a part of an electronic package in accordance with some embodiments of the present disclosure. For example, the antenna module 4 of FIG. 4A may be a cross-sectional view along line CC' in FIG. 5. The dielectric layers 10*a* and 11*a* in FIG. 4A are omitted in FIG. 5 for clarity and conciseness.

As shown in FIG. 5, in some embodiments, the antenna 10 is covered by the portion 12. The antenna 10 is rotated with respect to the portion 12. The portion 12 is rotated with respect to the antenna 10. For example, a side of the antenna 10 and a side of the portion 12 may be not parallel. For example, an angle θ1 is defined between a side of the antenna 10 and a side of the portion 12. The angle θ1 may be greater than zero.

In some embodiments, the antenna 11 is covered by the portion 13. The antenna 11 is rotated with respect to the portion 13. The portion 13 is rotated with respect to the antenna 11. For example, a side of the antenna 11 and a side of the portion 13 may be not parallel. For example, an angle θ2 is defined between a side of the antenna 11 and a side of the portion 13. The angle θ2 may be greater than zero.

Figure 6:
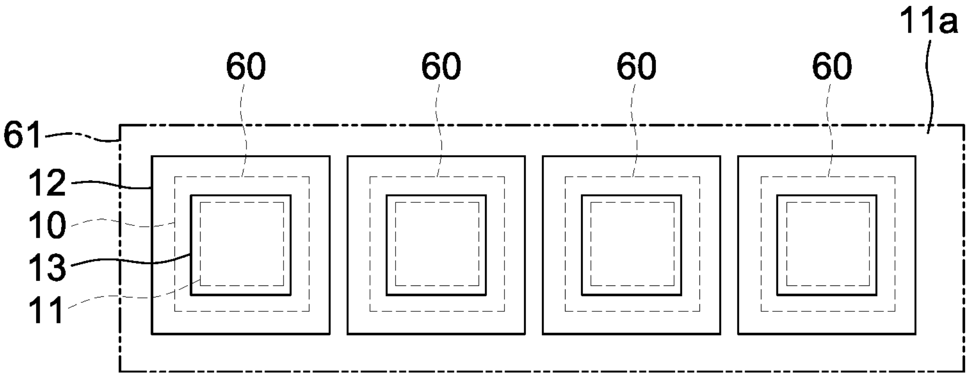
FIG. 6 illustrates a top view of a part of an electronic package in accordance with some embodiments of the present disclosure.

FIG. 6 illustrates a top view of a part of an electronic package in accordance with some embodiments of the present disclosure. In some embodiments, FIG. 6 illustrates a top view of a plurality of antenna modules, such as a plurality of the antenna modules 1 of FIG. 1A.

As shown in FIG. 6, the regions 60 are separated by a region 61. In some embodiments, the regions 60 may define an antenna array. For example, the regions 60 may be arranged in an array. In some embodiments, the regions 60 may be arranged randomly or irregularly. The region 60 may include the antennas 10 and 11. The regions 60 may be separated from each other by the portion 12. The regions 60 may be covered by the portion 12. The region 61 may be exposed from the portion 12.

Figure 7:
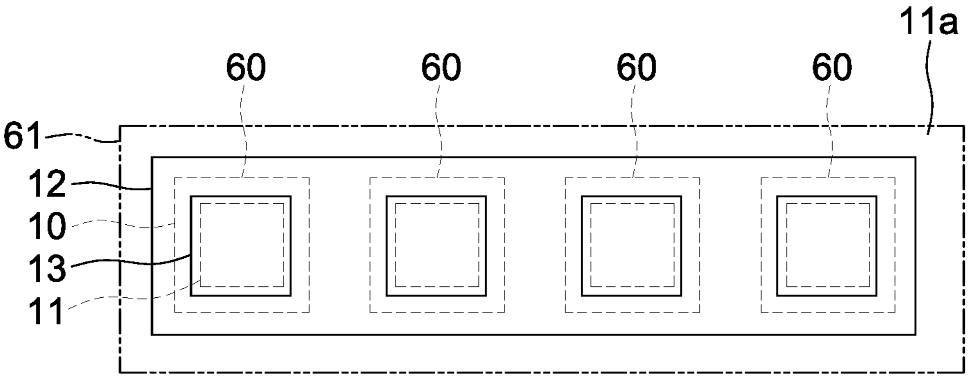
FIG. 7 illustrates a top view of a part of an electronic package in accordance with some embodiments of the present disclosure.

FIG. 7 illustrates a top view of a part of an electronic package in accordance with some embodiments of the present disclosure. The top view in FIG. 7 is similar to the top view in FIG. 6 except that the regions 60 are connected through the portion 12. For example, the same portion 12 is shared among the antennas 10 of the regions 60. In some embodiments, a better manufacturing rate can be obtained.

Figure 8:
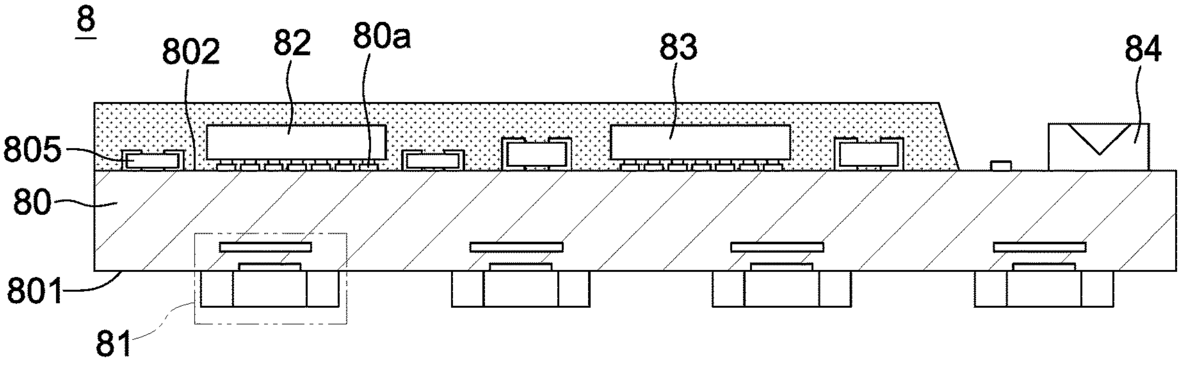
FIG. 8 illustrates a cross-sectional view of an electronic package in accordance with some embodiments of the present disclosure.

FIG. 8 illustrates a cross-sectional view of an electronic package 8 in accordance with some embodiments of the present disclosure. The electronic package 8 includes a carrier 80, an antenna module 81, electronic components 82, 83, and an electrical contact 84.

The carrier 80 has a surface 801 and a surface 802 opposite the surface 801. The carrier 80 may be, for example, a printed circuit board, such as a paper-based copper foil laminate, a composite copper foil laminate, or a polymer-impregnated glass-fiber-based copper foil laminate. In some embodiments, the carrier 80 may include an interconnection structure, such as a redistribution later (RDL), a grounding layer, and a feeding line. In some embodiments, the carrier 80 may include one or more conductive pads 80*a* in proximity to, adjacent to, or embedded in and exposed at the surface 802 of the carrier 80. The carrier 80 may include solder resists (or solder mask) (not illustrated in the figures) on the surface 802 of the carrier 80 to fully expose or to expose at least a portion of the conductive pads 80*a* for electrical connections.

The antenna module 81 may be disposed on the surface 801 of the carrier 80. The antenna module 81 may be one of the antenna module 1, the antenna module 1', the antenna module 2, the antenna module 3, and the antenna module 4.

The electronic component 82 and the electronic component 83 may be disposed on the surface 802 of the carrier 80. The electronic components 82 and 83 may each be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof. In some embodiments, the electronic components 82 and 83 may each be a transmitter, a receiver, or a transceiver. In some embodiments, the electronic components 82 and 83 may each include an RF IC. In some embodiments, there may be any number of electronic components depending on design requirements. The electronic components 82 and 83 may each be electrically connected to one or more of other electrical components and to the carrier 80, and the electrical connections may be attained by way of flip-chip or wire-bond techniques.

The electronic components 82 and 83 may each be electrically connected to the antenna module 81. In some embodiments, the signal transmission path between each of the electronic components 82 and 83 and the antenna module 81 may be attained by a feeding line in the carrier 80. In some embodiments, the feeding line may include, but is not limited to, a metal pillar, a bonding wire or stacked vias. In some embodiments, the feeding line may include Au, Ag, Al, Cu, or an alloy thereof.

The electrical contact 84 is disposed on the surface 802 of the carrier 80 and can provide electrical connections between the semiconductor package device 8 and external components (e.g., external circuits or circuit boards). In some embodiments, the electrical contact 84 may include a connector. In some embodiments, the electrical contact 84 may include a solder ball, such as a controlled collapse chip connection (C4) bump, a ball grid array (BGA) or a land grid array (LGA).

FIGS. 9A, 9B, 9C, 9D, 9E, and 9F illustrate stages of a method of manufacturing a part of an electronic package in accordance with some embodiments of the present disclosure. In some embodiments, the antenna module 1 in FIG. 1A may be manufactured by the operations described below with respect to the FIGS. 9A, 9B, 9C, 9D, 9E, and 9F.

Figure 9A:
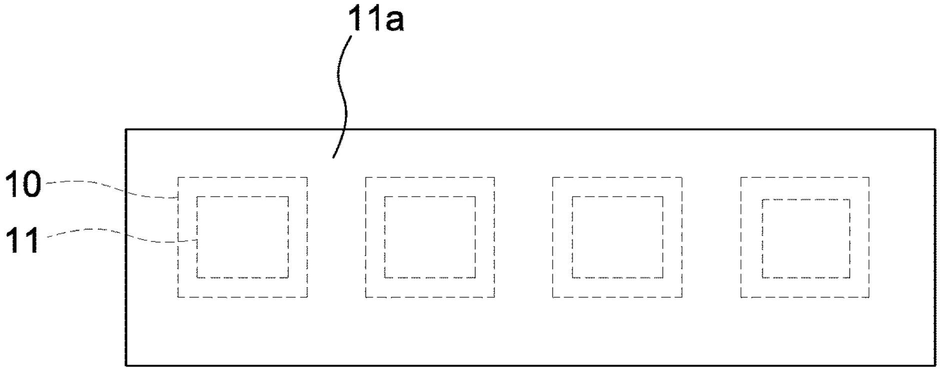
FIG. 9A illustrates one or more stages of a method of manufacturing a part of an electronic package in accordance with some embodiments of the present disclosure.

Referring to FIG. 9A, a radiating structure may be provided. The radiating structure may have pairs of antennas 10 and 11 overlapped with each other. Each pair of antennas 10 and 11 is separated. For example, each pair of antennas 10 and 11 may be located in the region 60 in FIG. 6, and separated by the region 61. The antenna 11 may be covered by the dielectric layer 11*a* and the antenna 10 may be covered by the dielectric layer 10*a* (which is blocked by the dielectric layer 11*a*).

Figure 9B:
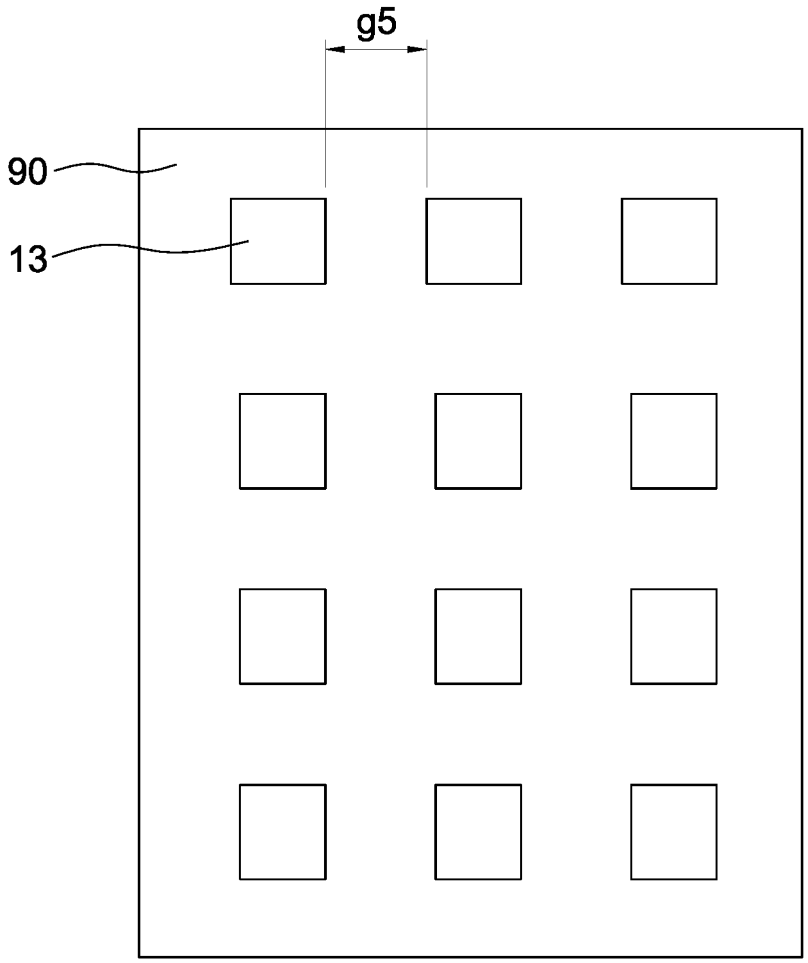
FIG. 9B illustrates one or more stages of a method of manufacturing a part of an electronic package in accordance with some embodiments of the present disclosure.

Referring to FIG. 9B, a carrier 90 may be provided, and a plurality of portions 13 may be disposed on the carrier 90. In some embodiments, the plurality of portions 13 may be separated. For example, one portion 13 may be spaced apart from an adjacent one by a gap g5. In some embodiments, the area of each portion 13 may be greater than the area of the antenna 11 in FIG. 9A. For example, the area of each portion 13 may be designed according to the area of the antenna 11. In some embodiments, the plurality of portions 13 may be formed by injection molding, compression molding, transfer molding, and so on.

Figure 9C:
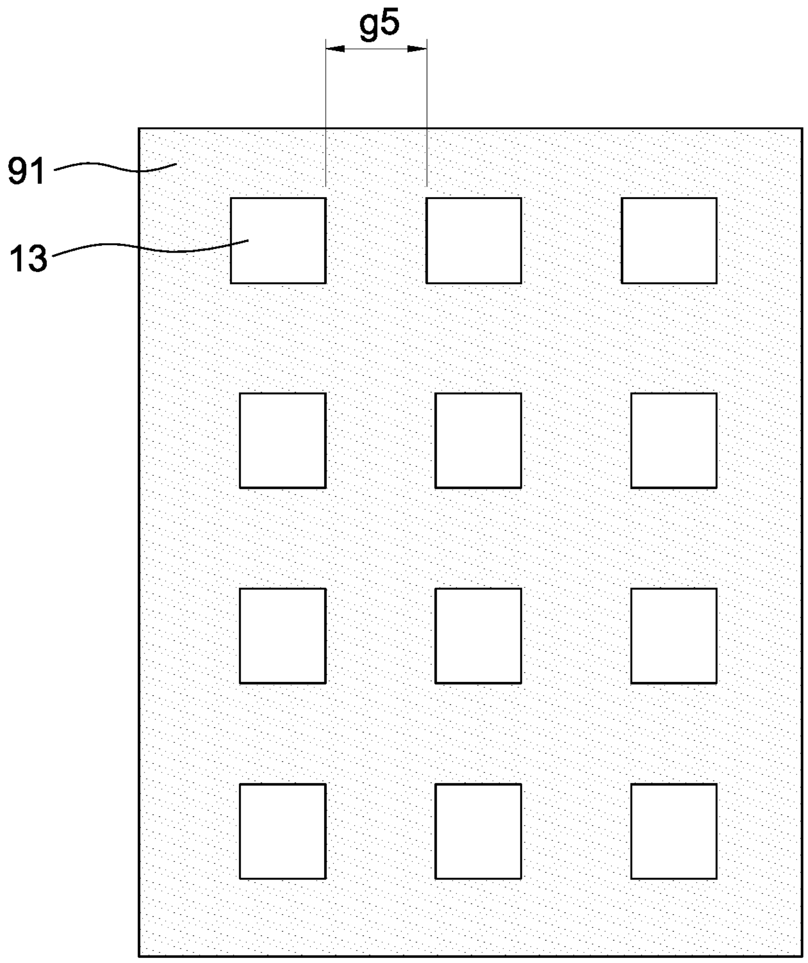
FIG. 9C illustrates one or more stages of a method of manufacturing a part of an electronic package in accordance with some embodiments of the present disclosure.

Referring to FIG. 9C, a material 91 of the portion 12 is formed on the carrier 90. In some embodiments, the material 91 is formed in the gap g5 in FIG. 9B. In some embodiments, the material 91 may be formed by injection molding, compression molding, transfer molding, and so on.

Figure 9D:
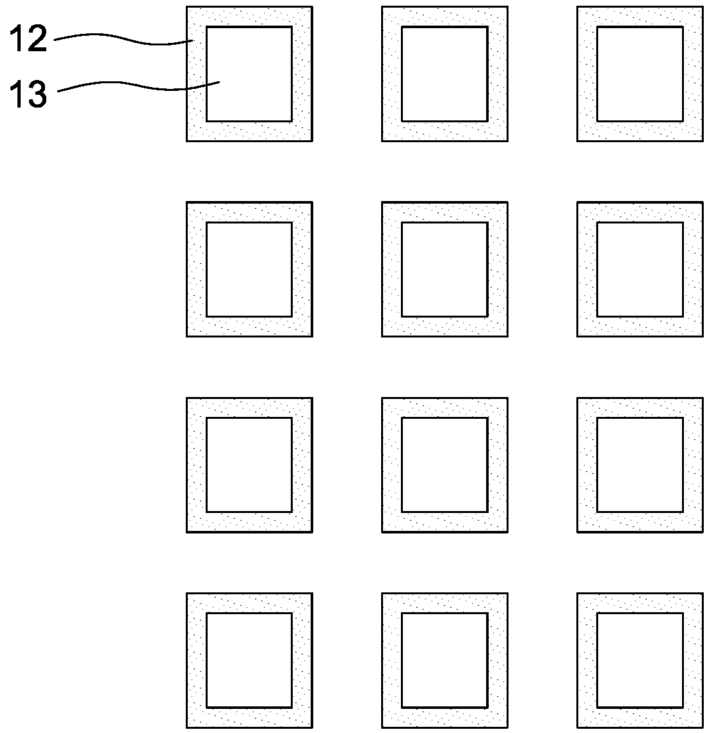
FIG. 9D illustrates one or more stages of a method of manufacturing a part of an electronic package in accordance with some embodiments of the present disclosure.

Referring to FIG. 9D, the structure in FIG. 9C may be divided into individual units or directing elements, each including one portion 13 surrounded by the portion 12. In some embodiments, the portion 13 and the portion 12 may be concentric. In some embodiments, the portion 13 and the portion 12 may be non-concentric. In some embodiments, the total area of each directing element may be greater than the area of the antenna 10 in FIG. 9A. In some embodiments, the carrier 91 may be removed from the directing elements. In some embodiments, the carrier 91 may be removed before the dividing operation.

Figure 9E:
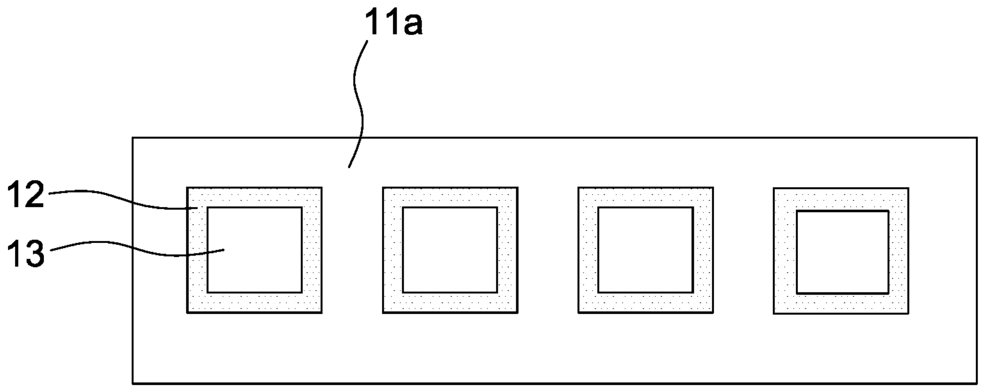
FIG. 9E illustrates one or more stages of a method of manufacturing a part of an electronic package in accordance with some embodiments of the present disclosure.
Figure 9F:
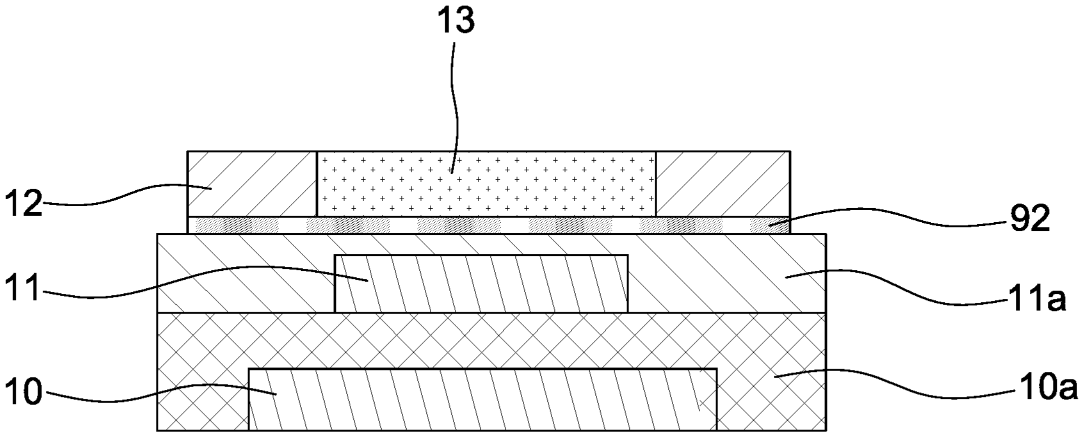
FIG. 9F illustrates one or more stages of a method of manufacturing a part of an electronic package in accordance with some embodiments of the present disclosure.

Referring to FIGS. 9E and 9F, the directing elements (including the portion 12 and the portion 13) obtained from FIG. 9D may be disposed on the radiating structure obtained from FIG. 9A. In some embodiments, the directing elements may be disposed on the radiating structure to cover each pair of antennas 10 and 11 located in the region 60 in FIG. 6 and to expose a part of the region 61. In some embodiments, a surface treatment, such as a plasma clean, may be conducted on the radiating structure before the directing elements are disposed on the radiating structure. In some embodiments, the directing elements may be attached to the radiating structure by a dispenser. In some embodiments, the directing elements may be attached to the radiating structure through an adhesive material 92. In some embodiments, the adhesive material 92 may have a material as listed above for the portion 12 and the portion 13. In some embodiments, the adhesive material 92 may help to secure the directing elements. In some embodiments, a heat treatment, such as a curing operation, may be conducted on the directing elements and the radiating structure after the directing elements are disposed on the radiating structure.

Figure 10A:
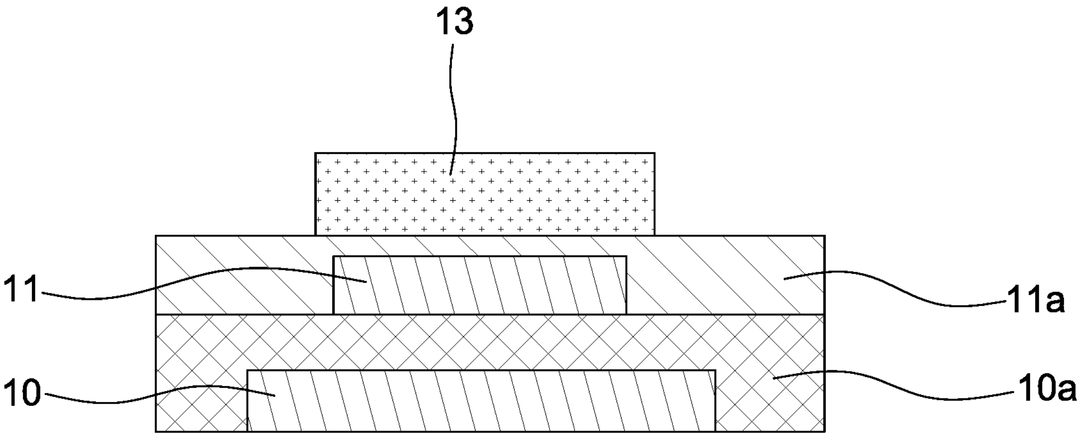
FIG. 10A illustrates one or more stages of a method of manufacturing a part of an electronic package in accordance with some embodiments of the present disclosure.
Figure 10B:
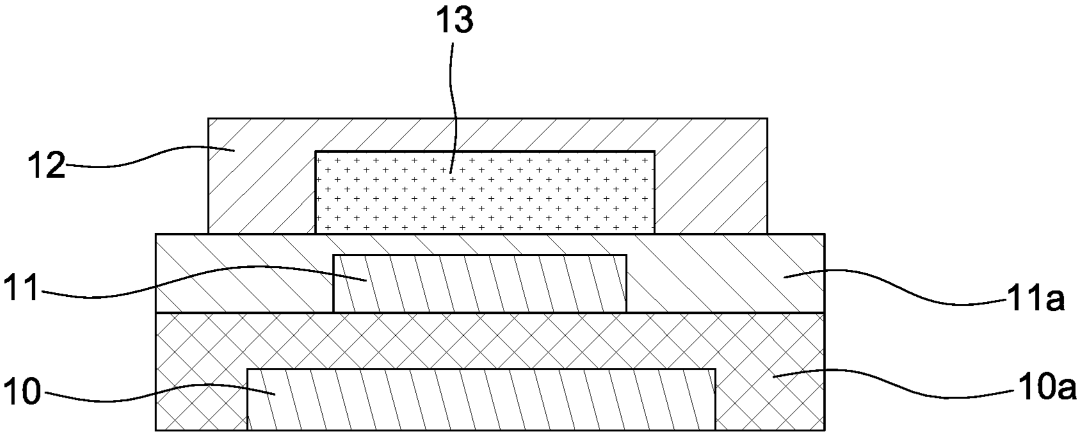
FIG. 10B illustrates one or more stages of a method of manufacturing a part of an electronic package in accordance with some embodiments of the present disclosure.

FIGS. 10A and 10B illustrate stages of a method of manufacturing a part of an electronic package in accordance with some embodiments of the present disclosure. In some embodiments, the antenna module 1 in FIG. 1A may be manufactured by the operations described below with respect to the FIGS. 10A and 10B.

Referring to FIG. 10A, a portion 13 may be disposed on the radiating structure obtained from the FIG. 9A. In some embodiments, the portion 13 may be formed by injection molding, compression molding, transfer molding, and so on.

Referring to FIG. 10B, a portion 12 may be disposed on the radiating structure and cover the portion 13. In some embodiments, the portion 12 may be formed by injection molding, compression molding, transfer molding, and so on. In some embodiments, a part of the portion 12 may be removed to expose the portion 13. In some embodiments, after the portion 13 is exposed, the portion 12 and the portion 13 may be substantially coplanar.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:

an antenna structure having a first antenna and a second antenna at least partially covered by the first antenna; and a directing element covering the antenna structure, the directing element having a first portion configured to direct a first electromagnetic wave having a first frequency to transmit via the first antenna and a second portion configured to direct a second electromagnetic wave having a second frequency different from the first frequency to transmit via the second antenna, wherein the first portion of the directing element has an area larger than an area of the first antenna and less than an area of the second antenna.

2. The electronic package of claim 1, wherein the antenna structure comprises a first dielectric layer covering the first antenna and a second dielectric layer, on which the first dielectric layer is disposed, covering the second antenna.

3. The electronic package of claim 2, wherein a dielectric constant (Dk) of each of the first portion and the second portion of the directing element is higher than the first dielectric layer and the second dielectric layer.

4. The electronic package of claim 1, wherein the first antenna has a width less than a width of the second antenna.

5. The electronic package of claim 1, wherein a width of a projection of the directing element on the second antenna is substantially equal to a width of the second antenna.

6. The electronic package of claim 1, wherein the second portion of the directing element is around the first portion of the directing element.

7. The electronic package of claim 1, wherein the antenna structure further comprises a plurality of first regions and a second region, wherein the directing element covers the plurality of first regions, and wherein the plurality of first regions are separated from each other by the second region.

8. The electronic package of claim 1, wherein the first antenna is configured to operate with an operating frequency higher than an operating frequency of the second antenna.

9. The electronic package of claim 8, wherein a Dk of the first portion of the directing element is higher than a Dk of the second portion of the directing element.

10. The electronic package of claim 2, wherein a lateral surface of the directing element is misaligned with a lateral surface of the first dielectric layer or a lateral surface of the second dielectric layer.

11. The electronic package of claim 1, wherein the first portion of the directing element is configured to guide the first electromagnetic wave radiated from the first antenna to an outside of the electronic package.

12. The electronic package of claim 1, wherein the second portion of the directing element is configured to guide the second electromagnetic wave radiated from the second antenna to an outside of the electronic package.

13. The electronic package of claim 1, wherein a surface of the first portion of the directing element facing away from the antenna structure is substantially aligned with a surface of the second portion of the directing element facing away from the antenna structure.

14. An electronic package, comprising:

an antenna structure having a first region and a second region; and a directing element covering the first region of the antenna structure and exposing a part of the second region of the antenna structure, the directing element having a first portion configured to direct a first electromagnetic wave having a first frequency to transmit within the first portion and a second portion configured to direct a second electromagnetic wave having a second frequency different from the first frequency to transmit within the second portion, wherein the antenna structure comprises a first antenna and a second antenna within the first region, and wherein the first antenna is disposed between the direction element and the second antenna, and wherein a width of a projection of the first portion of the directing element on the second antenna is less than a width of the second antenna.

15. The electronic package of claim 14, wherein the antenna structure further comprises a plurality of first regions separated from each other by the second region.

* * * * *